(12) United States Patent
Lu

(10) Patent No.: US 8,104,356 B2
(45) Date of Patent: Jan. 31, 2012

(54) PRESSURE SENSING DEVICE PACKAGE AND MANUFACTURING METHOD THEREOF

(75) Inventor: Chih-Wei Lu, Hsinchu (TW)

(73) Assignee: Unimicron Technology Corp., Taoyuan (TW)

(*) Notice: Subject to any disclaimer, the term of this patent is extended or adjusted under 35 U.S.C. 154(b) by 740 days.

(21) Appl. No.: 12/191,267

(22) Filed: Aug. 13, 2008

(65) Prior Publication Data

US 2009/0314095 A1 Dec. 24, 2009

(30) Foreign Application Priority Data

Jun. 19, 2008 (TW) ............................ 97122867 A

(51) Int. Cl.
*G01L 9/06* (2006.01)
(52) U.S. Cl. .............................. 73/727; 73/715
(58) Field of Classification Search .................. 73/706, 73/715, 723, 724, 725, 753, 754
See application file for complete search history.

(56) References Cited

U.S. PATENT DOCUMENTS

| | | | |
|---|---|---|---|
| 6,401,545 B1 | 6/2002 | Monk et al. ................. 73/756 |
| 6,962,282 B2 * | 11/2005 | Manansala ............... 228/180.5 |
| 7,401,523 B2 * | 7/2008 | Meehan et al. ............... 73/718 |
| 7,791,181 B2 * | 9/2010 | Chen et al. .................. 257/676 |
| 7,938,014 B2 * | 5/2011 | Meehan et al. ............... 73/780 |
| 2006/0163726 A1 * | 7/2006 | Kierse et al. ............... 257/737 |
| 2006/0191351 A1 * | 8/2006 | Meehan et al. ............... 73/780 |

FOREIGN PATENT DOCUMENTS

| | | |
|---|---|---|
| JP | 08-210935 | 8/1996 |
| TW | 460994 | 10/2001 |
| TW | 512505 | 12/2002 |
| TW | 569017 | 1/2004 |
| TW | I242749 | 11/2005 |
| TW | 200807732 | 2/2008 |

OTHER PUBLICATIONS

Chinese First Examination Report of China Application No. 200810128455.6, dated Dec. 1, 2010.
"Office Action of Taiwan Counterpart Application", issued on Nov. 30, 2011, p1-p6, in which the listed reference was cited.

* cited by examiner

*Primary Examiner* — Freddie Kirkland, III
(74) *Attorney, Agent, or Firm* — J.C. Patents

(57) ABSTRACT

A pressure sensing device package including a circuit substrate, a pressure sensing device, a molding compound, and a flexible protection layer is provided. The circuit substrate has an opening. The pressure sensing device is flip chip bonded to the circuit substrate and has a sensing region facing toward the opening. The molding compound encapsulates the pressure sensing device but exposes the sensing region. The flexible protection layer is disposed on the sensing region and exposed by the opening of the circuit substrate.

19 Claims, 3 Drawing Sheets

PRESSURE SENSING DEVICE PACKAGE AND MANUFACTURING METHOD THEREOF

CROSS-REFERENCE TO RELATED APPLICATION

This application claims the priority benefit of Taiwan application serial no. 97122867, filed on Jun. 19, 2008. The entirety of the above-mentioned patent application is hereby incorporated by reference herein and made a part of this specification.

BACKGROUND OF THE INVENTION

1. Field of the Invention

The present invention relates to a sensing device package and a manufacturing method thereof. More particularly, the present invention relates to a pressure sensing device package and a manufacturing method thereof.

2. Description of Related Art

A pressure sensor detects the value of gas or liquid pressure undertaken (or contacted) by a pressure sensing device. In the pertinent art, the pressure sensing device is fixed to a premold leadframe and wire bonded to the leadframe, so as to allow signals of the pressure sensing device to be output through the leadframe. Thereafter, a lid is used to cover the pressure sensing device, such that a pressure sensing device package is formed. In an alternative, the pressure sensing device is fixed to the leadframe and wire bonded to the leadframe. Next, a molding compound is utilized for encapsulating the pressure sensing device, wires, and a portion of the leadframe, so as to form the pressure sensing device package.

The conventional pressure sensing device is disposed on the leadframe and electrically connected to leads by wire bonding. Thereby, the conventional pressure sensing device package has a relatively large size, which is detrimental to the miniaturization of the pressure sensing device.

SUMMARY OF THE INVENTION

The present invention is directed to a pressure sensing device package with a relatively small size.

The present invention is further directed to a manufacturing method of a pressure sensing device package. Implementation of said manufacturing method is conducive to miniaturization of the pressure sensing device package.

The present invention provides a pressure sensing device package including a circuit substrate, a pressure sensing device, a molding compound, and a flexible protection layer. The circuit substrate has an opening. The pressure sensing device is flip chip bonded to the circuit substrate and has a sensing region facing toward the opening. The molding compound encapsulates the pressure sensing device but exposes the sensing region. The flexible protection layer is disposed on the sensing region and exposed by the opening of the circuit substrate.

In an embodiment of the present invention, the pressure sensing device includes a pressure sensing chip and a glass. The pressure sensing chip has a pressure sensing thin film disposed within the sensing region. The glass is adhered to a region of the pressure sensing chip where the pressure sensing thin film is not disposed. In addition, the glass and the pressure sensing thin film together form a hermetic chamber.

In an embodiment of the present invention, the pressure sensing device package further includes a plurality of conductive bumps, and the pressure sensing chip is flip chip bonded to the circuit substrate through the conductive bumps.

In an embodiment of the present invention, the pressure sensing device package further includes a dam disposed between the pressure sensing device and the circuit substrate and surrounding the pressure sensing device.

In an embodiment of the present invention, the pressure sensing device package further includes an application specific integrated circuit (ASIC) chip disposed on and electrically connected to the circuit substrate.

In an embodiment of the present invention, the molding compound further encapsulates the ASIC chip.

In an embodiment of the present invention, the ASIC chip is fixed to the circuit substrate and wire bonded to the circuit substrate.

In an embodiment of the present invention, the ASIC chip is flip chip bonded to the circuit substrate.

In an embodiment of the present invention, the ASIC chip is fixed to the pressure sensing device and wire bonded to the circuit substrate.

In an embodiment of the present invention, the pressure sensing device package further includes a plurality of conductive balls disposed on a surface of the circuit substrate. Said surface of the circuit substrate is away from the pressure sensing device.

In an embodiment of the present invention, a material of the flexible protection layer includes silicone.

In an embodiment of the present invention, the flexible protection layer is further disposed in a gap formed by the circuit substrate and the pressure sensing device.

The present invention further provides a manufacturing method of a pressure sensing device package. In the manufacturing method, a pressure sensing device is flip chip bonded to a circuit substrate at first. Here, the circuit substrate has an opening, and the pressure sensing device has a sensing region facing toward the opening. Thereafter, a molding compound is formed to encapsulate the pressure sensing device without encapsulating the sensing region. After that, a flexible protection layer is formed on the sensing region and exposed by the opening of the circuit substrate.

In an embodiment of the present invention, the pressure sensing device includes a pressure sensing chip and a glass. The pressure sensing chip is flip chip bonded to the circuit substrate and has a pressure sensing thin film that is disposed within the sensing region and positioned above the opening. The glass is adhered to the pressure sensing chip, and the glass and the pressure sensing thin film together form a hermetic chamber.

In an embodiment of the present invention, the pressure sensing chip is flip chip bonded to the circuit substrate through a plurality of conductive bumps in the step of flip chip bonding the pressure sensing device to the circuit substrate.

In an embodiment of the present invention, before the molding compound is formed, the manufacturing method of the pressure sensing device package further includes forming a dam between the pressure sensing device and the circuit substrate. The dam surrounds the pressure sensing device to prevent the molding compound from encapsulating the sensing region.

In an embodiment of the present invention, before the molding compound is formed, the manufacturing method of the pressure sensing device package further includes disposing an ASIC chip on the circuit substrate. The ASIC chip is electrically connected to the circuit substrate.

In an embodiment of the present invention, the molding compound further encapsulates the ASIC chip in the step of forming the molding compound.

In an embodiment of the present invention, the step of electrically connecting the ASIC chip to the circuit substrate includes flip chip bonding the ASIC chip to the circuit substrate.

In an embodiment of the present invention, the step of electrically connecting the ASIC chip to the circuit substrate includes fixing the ASIC chip to the circuit substrate and wire bonding the ASIC chip to the circuit substrate.

In an embodiment of the present invention, the step of electrically connecting the ASIC chip to the circuit substrate includes fixing the ASIC chip to the pressure sensing device and wire bonding the ASIC chip to the circuit substrate.

In an embodiment of the present invention, the manufacturing method of the pressure sensing device package further includes forming a plurality of conductive balls on a surface of the circuit substrate.

In an embodiment of the present invention, a gap formed by the circuit substrate and the pressure sensing device is further filled with the flexible protection layer in the step of forming the flexible protection layer.

In the present invention, the pressure sensing device is disposed on the circuit substrate by flip chip bonding. Here, a carrier (the circuit substrate) required by flip chip bonding occupies a smaller area than a carrier (the leadframe) required by wire bonding does. Hence, the volume of the pressure sensing device package in the present invention is less than the volume of the conventional pressure sensing device package.

In order to make the above and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
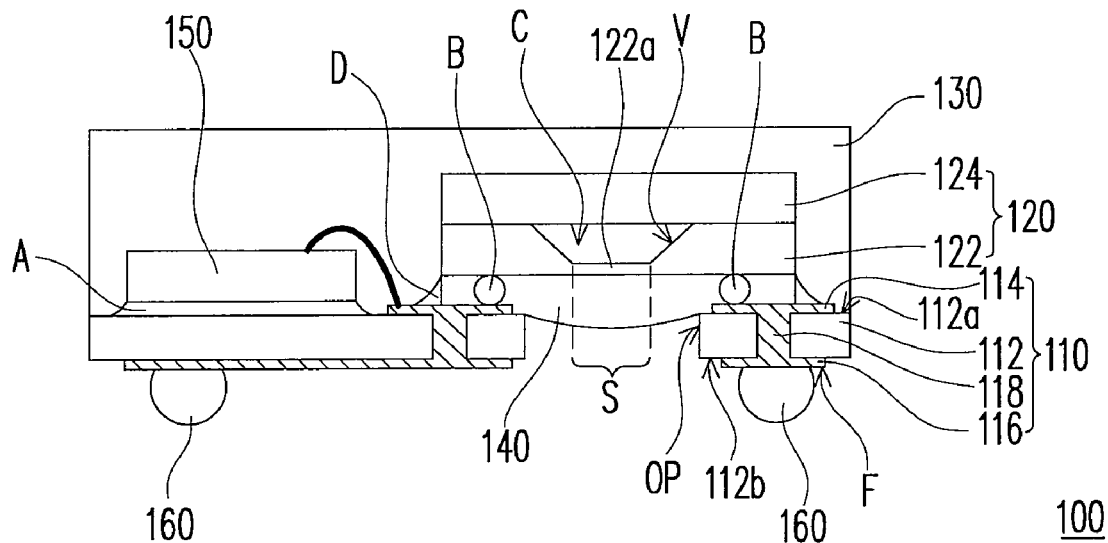
FIG. 1 is a schematic cross-sectional view of a pressure sensing device package according to an embodiment of the present invention.
Figure 2:
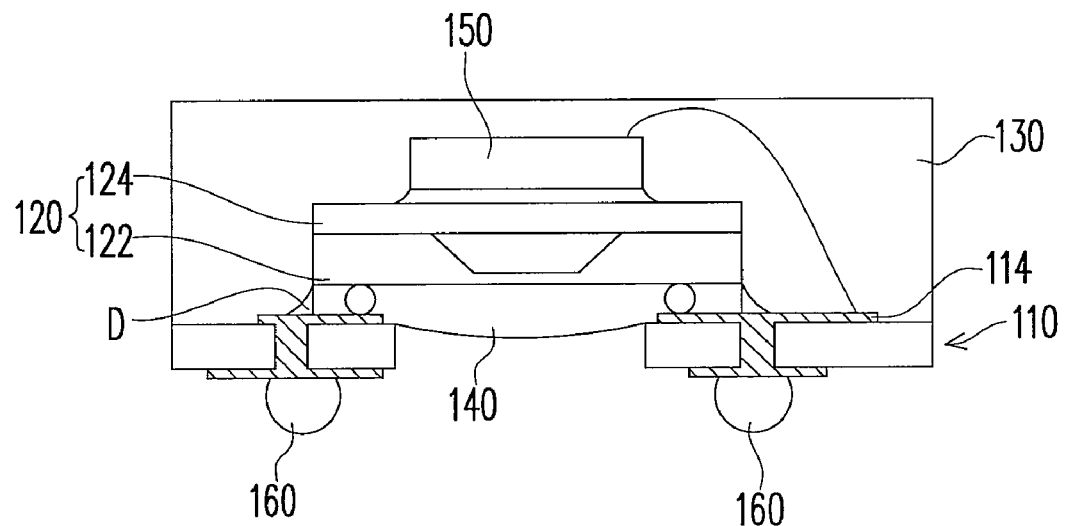
FIG. 2 is a schematic cross-sectional view of a pressure sensing device package according to another embodiment of the present invention.

FIG. 1 is a schematic cross-sectional view of a pressure sensing device package according to an embodiment of the present invention. FIG. 2 is a schematic cross-sectional view of a pressure sensing device package according to another embodiment of the present invention.

As shown in FIG. 1, the present embodiment provides a pressure sensing device package 100 including a circuit substrate 110, a pressure sensing device 120, a molding compound 130, and a flexible protection layer 140.

The circuit substrate 110 has an opening OP. Here, the circuit substrate 110 is, for example, a single-layered circuit substrate or a multi-layered circuit substrate. In the present embodiment, the circuit substrate 110 has a base layer 112, a first circuit layer 114, a second circuit layer 116, and a plurality of conductive channels 118. The first circuit layer 114 and the second circuit layer 116 are respectively disposed on an upper surface 112a and a lower surface 112b of the base layer 112. The conductive channels 118 pass through the base layer 112 and are electrically connected to the first circuit layer 114 and the second circuit layer 116.

The pressure sensing device 120 is flip chip bonded to the circuit substrate 110 and has a sensing region S facing toward the opening OP. Specifically, the pressure sensing device 120 of the present embodiment is flip chip bonded to the first circuit layer 114 of the circuit substrate 110 through a plurality of conductive bumps B. The conductive bumps B are, for example, gold bumps or other appropriate bumps.

Note that the pressure sensing device 120 is disposed on the circuit substrate 110 by flip chip bonding in the present embodiment, which is different from the related art. Here, the flip chip bonding is referred to as connecting the pressure sensing device 120 to the circuit substrate 110 through the conductive bumps B underlying the pressure sensing device 120. In comparison with the flip chip bonding, the conventional wire bonding is referred to as extending the pressure sensing device to a plurality of leads of a leadframe in a direction away from the pressure sensing device through a plurality of wires.

Hence, a carrier (the circuit substrate 110) required by flip chip bonding occupies a smaller area than a carrier (the leadframe) required by wire bonding does. As such, the volume of the pressure sensing device package 100 in the present embodiment is less than the volume of the conventional pressure sensing device package, which is conducive to the miniaturization of the pressure sensing device package 100 in the present embodiment.

In the present embodiment, the pressure sensing device 120 includes a pressure sensing chip 122 and a glass 124. The pressure sensing chip 122 has a pressure sensing thin film 122a disposed within the sensing region S. According to the present embodiment, the pressure sensing chip 122 has a V groove opposite to the sensing region S, and the bottom of the V groove is constituted by the pressure sensing thin film 122a. By means of the pressure sensing thin film 122a, the pressure sensing chip 122 is capable of detecting external liquid pressure exerted on the opening OP.

The glass 124 is adhered to the pressure sensing chip 122, and the glass 124 and the pressure sensing thin film 122a together form a hermetic chamber C. In particular, the hermetic chamber C is formed by using the glass 124 to seal the V groove of the pressure sensing chip 122. Besides, the hermetic chamber C can be in a vacuum state.

Additionally, according to the present embodiment, an ASIC chip 150 can be further disposed on the circuit substrate 110, so as to manage pressure signals detected by the pressure sensing device 120. The ASIC chip 150 is electrically connected to the circuit substrate 110. Besides, the ASIC chip 150 is electrically connected to the pressure sensing device 120 through the circuit substrate 110, so as to receive the signals of the pressure sensing device 120. In the present embodiment, the ASIC chip 150 is, for example, fixed to the circuit substrate 110 through an adhesive layer A, and the ASIC chip 150 is wire bonded to the first circuit layer 114 of the circuit substrate 110.

On the other hand, referring to FIG. 2, the ASIC chip 150 in other embodiments can also be fixed to the pressure sensing device 120 and wire bonded to the circuit substrate 110. Specifically, the ASIC chip 150 is fixed to the glass 124. In other embodiments that are not depicted in the drawings, the ASIC chip 150 is also able to be flip chip bonded to the circuit substrate 110. Note that the ASIC chip 150 can also be disposed on other packages and then electrically connected to the pressure sensing device 120 according to other embodiments that are not depicted in the drawings.

As indicated in FIG. 1, the molding compound 130 encapsulates the pressure sensing device 120 but exposes the sensing region S. In addition, the molding compound 130 further encapsulates the ASIC chip 150. Given that the molding compound 130 also encapsulates the sensing region S, the accuracy of the pressure sensing device 120 would be negatively affected. Accordingly, in the present embodiment, a dam D is disposed between the pressure sensing device 120 and the circuit substrate 110. The dam D surrounds the periphery of the pressure sensing device 120, so as to prevent the molding compound 130 from overflowing to the sensing region S during the implementation of the manufacturing process. Here, the dam D is, for example, made of an epoxy encapsulant.

To protect the pressure sensing thin film 122a from being polluted or damaged by external forces, the flexible protection layer 140 is disposed on the sensing region S according to the present embodiment. The flexible protection layer 140 is exposed by the opening OP of the circuit substrate 110, such that the external pressure applied to the opening OP can be received by the flexible protection layer 140 through the opening OP. As such, the flexible protection layer 140 is able to transmit the pressure to the pressure sensing thin film 122a.

In addition, the flexible protection layer 140 can also be disposed within a gap formed by the circuit substrate 110 and the pressure sensing device 120, so as to encapsulate and protect the conductive bumps B disposed between the circuit substrate 110 and the pressure sensing device 120. In the present embodiment, a material of the flexible protection layer 140 includes flexible materials, such as silicone. Thereby, the flexible protection layer 140 can serve to protect the conductive bumps B and transmit the pressure.

Moreover, a plurality of conductive balls 160 (e.g. solder balls) can be further disposed on a surface F of the second circuit layer 116 of the circuit substrate 110 in the present embodiment, so as to enable the pressure sensing device package 100 to be electrically connected to other electronic devices. Particularly, the conductive balls 160 are disposed on and electrically connected to the second circuit layer 116.

A manufacturing method of the aforesaid pressure sensing device package 100 according to an embodiment of the present invention will be elaborated hereinafter.

FIGS. 3A through 3F are schematic cross-sectional flowcharts of manufacturing a pressure sensing device package according to an embodiment of the present invention.

Figure 3A:
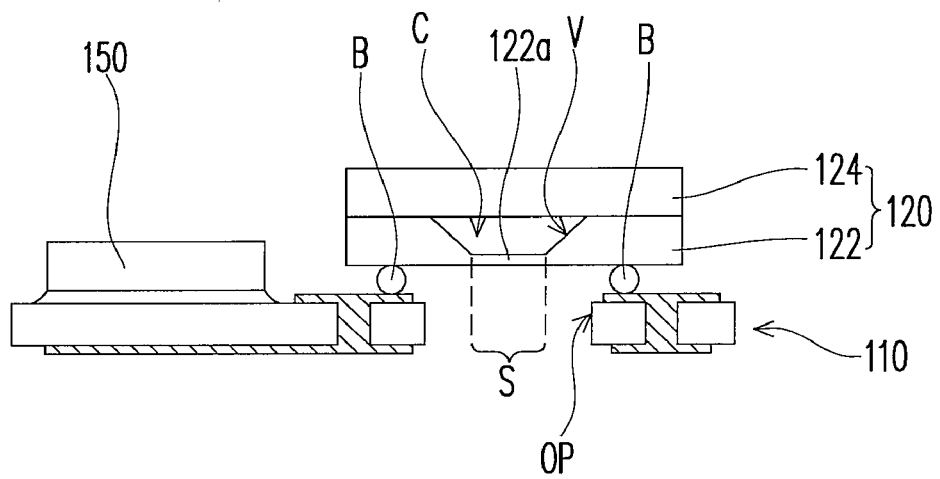
FIGS. 3A through 3F are schematic cross-sectional flowcharts of manufacturing a pressure sensing device package according to an embodiment of the present invention.
Figure 3B:
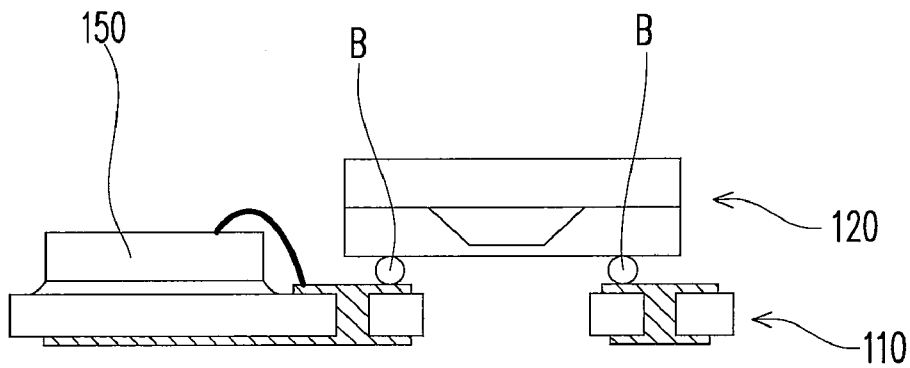

First, referring to FIG. 3A, a pressure sensing device 120 is flip chip bonded to a circuit substrate 110. Here, the circuit substrate 110 has an opening OP, and the pressure sensing device 120 has a sensing region S facing toward the opening OP.

Besides, the pressure sensing device 120 of the present embodiment includes a pressure sensing chip 122 and a glass 124. The pressure sensing chip 122 is flip chip bonded to the circuit substrate 110 through a plurality of conductive bumps B. In addition, the pressure sensing chip 122 has a pressure sensing thin film 122a that is disposed within the sensing region S and positioned above the opening OP. The glass 124 is adhered to the pressure sensing chip 122, and the glass 124 and the pressure sensing thin film 122a together form a hermetic chamber C, such that the pressure sensing device 120 is able to detect gas pressure.

Moreover, an ASIC chip 150 is further disposed on the circuit substrate 110 to manage pressure signals detected by the pressure sensing device 120 according to the present embodiment. Next, referring to FIG. 3B, the circuit substrate 110 and the ASIC chip 150 are electrically connected by wire bonding in the present embodiment, and the ASIC chip 150 can be electrically connected to the pressure sensing device 120 through the circuit substrate 110.

In other embodiments that are not depicted in the drawings, the ASIC chip 150 can also be flip chip bonded to the circuit substrate 110. Alternatively, the ASIC chip 150 can be fixed to the glass 124 and wire bonded to the circuit substrate 110.

Figure 3C:
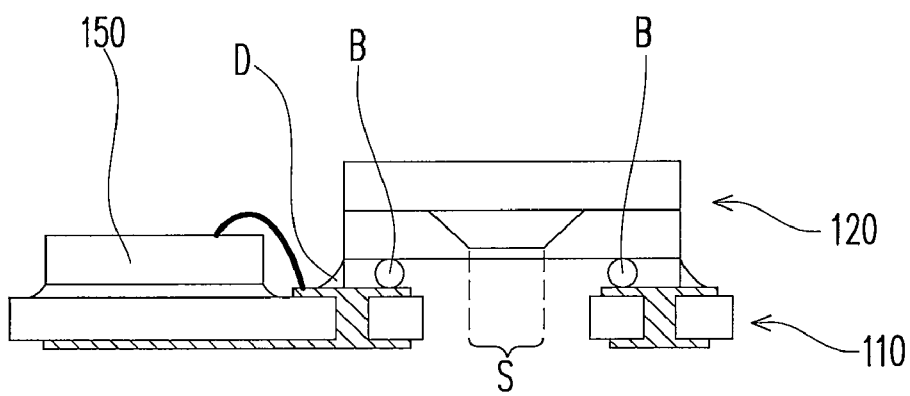

Thereafter, referring to FIG. 3C, a dam D is formed between the pressure sensing device 120 and the circuit substrate 110 according to the present embodiment. The dam D surrounds the periphery of the pressure sensing device 120, so as to prevent a subsequently formed molding compound from overflowing to the sensing region S and negatively affecting the accuracy of the pressure sensing device 120.

Figure 3D:
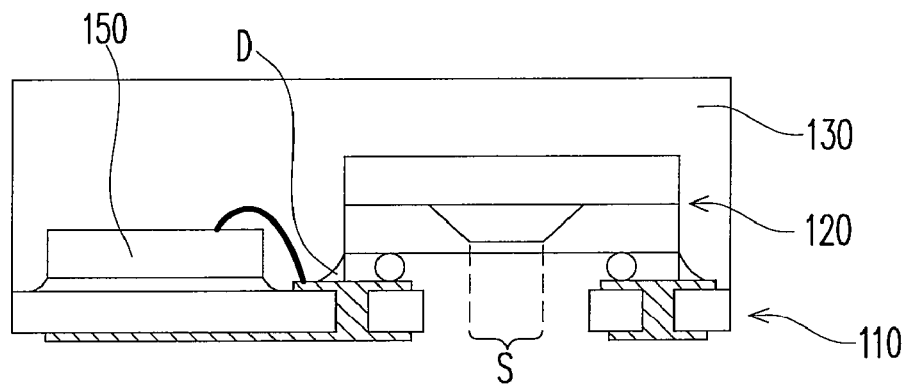

Referring to FIG. 3D, a molding compound 130 is then formed to encapsulate the pressure sensing device 120 without encapsulating the sensing region S. Specifically, when the molding compound 130 is formed on the circuit substrate 110, the molding compound 130 is blocked by the dam D and would not overflow into the sensing region S. In addition, the molding compound 130 further encapsulates the ASIC chip 150.

Figure 3E:
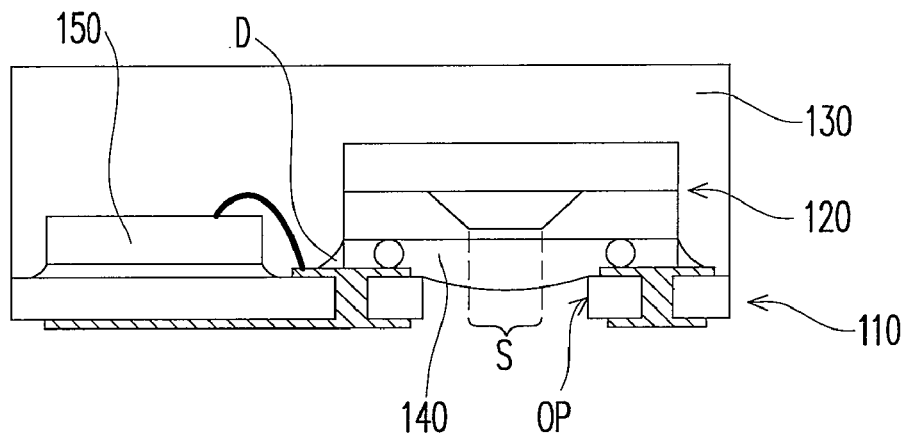

Next, referring to FIG. 3E, a flexible protection layer 140 is formed on the sensing region S and exposed by the opening OP of the circuit substrate 110. Besides, in the present embodiment, a gap formed by the circuit substrate 110 and the pressure sensing device 120 can also be filled with the flexible protection layer 140, such that the conductive bumps B can be encapsulated.

Figure 3F:
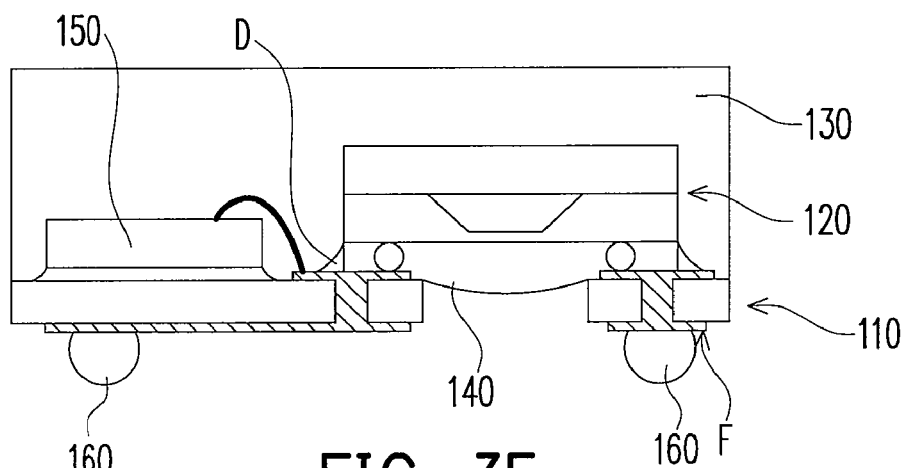

Afterwards, referring to FIG. 3F, a plurality of conductive balls 160 can be further disposed on a surface F of a second circuit layer 116 of the circuit substrate 110 in the present embodiment, so as to enable the pressure sensing device package 100 to be electrically connected to other electronic devices.

To sum up, in the present invention, the pressure sensing device is disposed on the circuit substrate by flip chip bonding. Here, the carrier (the circuit substrate) required by flip chip bonding occupies a smaller area than the carrier (the leadframe) required by wire bonding does. As such, the volume of the pressure sensing device package in the present invention is less than the volume of the conventional pressure sensing device package, which is conducive to the miniaturization of the pressure sensing device package in the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A pressure sensing device package, comprising:
a circuit substrate, having an opening;
a pressure sensing device, flip chip bonded to the circuit substrate and having a sensing region facing toward the opening, and comprising:
a pressure sensing chip, having a pressure sensing thin film disposed within the sensing region; and
a glass, adhered to a surface of the pressure sensing chip, wherein the surface is away from the pressure sensing thin film;
a molding compound, encapsulating the pressure sensing device but exposing the sensing region; and a flexible protection layer, disposed on the sensing region, covering the sensing region entirely, and exposed by the opening of the circuit substrate.

2. The pressure sensing device package as claimed in claim 1, wherein
the glass and the pressure sensing thin film together form a hermetic chamber.

3. The pressure sensing device package as claimed in claim 1, further comprising:
a plurality of conductive bumps, wherein the pressure sensing chip is flip chip bonded to the circuit substrate through the conductive bumps.

4. The pressure sensing device package as claimed in claim 1, further comprising:
a dam, disposed between the pressure sensing device and the circuit substrate and surrounding the pressure sensing device.

5. The pressure sensing device package as claimed in claim 1, further comprising:
an application specific integrated circuit (ASIC) chip, disposed on and electrically connected to the circuit substrate.

6. The pressure sensing device package as claimed in claim 5, wherein the molding compound further encapsulates the ASIC chip.

7. The pressure sensing device package as claimed in claim 5, wherein the ASIC chip is fixed to the circuit substrate and wire bonded to the circuit substrate.

8. The pressure sensing device package as claimed in claim 1, further comprising:
a plurality of conductive balls, disposed on a surface of the circuit substrate.

9. The pressure sensing device package as claimed in claim 1, wherein a material of the flexible protection layer comprises silicone.

10. The pressure sensing device package as claimed in claim 1, wherein the flexible protection layer is further disposed in a gap formed by the circuit substrate and the pressure sensing device.

11. A manufacturing method of a pressure sensing device package, the manufacturing method comprising:
flip chip bonding a pressure sensing device to a circuit substrate, wherein the circuit substrate has an opening, and the pressure sensing device has a sensing region facing toward the opening and comprises:
a pressure sensing chip, having a pressure sensing thin film disposed within the sensing region; and
a glass, adhered to a surface of the pressure sensing chip, wherein the surface is away from the pressure sensing thin film;
forming a molding compound to encapsulate the pressure sensing device without encapsulating the sensing region; and
forming a flexible protection layer on the sensing region, wherein the flexible protection layer covers the sensing region entirely and is exposed by the opening of the circuit substrate.

12. The manufacturing method of the pressure sensing device package as claimed in claim 11, wherein
the pressure sensing chip is flip chip bonded to the circuit substrate and the pressure sensing thin film is positioned above the opening; and
wherein the glass and the pressure sensing thin film together form a hermetic chamber.

13. The manufacturing method of the pressure sensing device package as claimed in claim 11, wherein the pressure sensing chip is flip chip bonded to the circuit substrate through a plurality of conductive bumps in the step of flip chip bonding the pressure sensing device to the circuit substrate.

14. The manufacturing method of the pressure sensing device package as claimed in claim 11, wherein before the step of forming the molding compound, the manufacturing method further comprises:
forming a dam between the pressure sensing device and the circuit substrate, wherein the dam surrounds the pressure sensing device to prevent the molding compound from encapsulating the sensing region.

15. The manufacturing method of the pressure sensing device package as claimed in claim 11, wherein before the step of forming the molding compound, the manufacturing method further comprises:
disposing an application specific integrated circuit (ASIC) chip on the circuit substrate, wherein the ASIC chip is electrically connected to the circuit substrate.

16. The manufacturing method of the pressure sensing device package as claimed in claim 15, wherein the molding compound further encapsulates the ASIC chip in the step of forming the molding compound.

17. The manufacturing method of the pressure sensing device package as claimed in claim 15, wherein the step of electrically connecting the ASIC chip to the circuit substrate comprises fixing the ASIC chip to the circuit substrate and wire bonding the ASIC chip to the circuit substrate.

18. The manufacturing method of the pressure sensing device package as claimed in claim 11, further comprising:
forming a plurality of conductive balls on a surface of the circuit substrate.

19. The manufacturing method of the pressure sensing device package as claimed in claim 11, further comprising filling a gap formed by the circuit substrate and the pressure sensing device with the flexible protection layer in the step of forming the flexible protection layer.

* * * * *